US009917159B2

(12) United States Patent
Hutzler et al.

(10) Patent No.: US 9,917,159 B2
(45) Date of Patent: Mar. 13, 2018

(54) SEMICONDUCTOR DEVICE COMPRISING PLANAR GATE AND TRENCH FIELD ELECTRODE STRUCTURE

(71) Applicant: Infineon Technologies Austria AG, Villach (AT)

(72) Inventors: Michael Hutzler, Villach (AT); Franz Hirler, Isen (DE); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/672,364

(22) Filed: Mar. 30, 2015

(65) Prior Publication Data

US 2016/0293714 A1 Oct. 6, 2016

(51) Int. Cl.
| | |
|---|---|
| *H01L 29/06* | (2006.01) |
| *H01L 29/78* | (2006.01) |
| *H01L 29/10* | (2006.01) |
| *H01L 29/739* | (2006.01) |
| *H01L 29/40* | (2006.01) |
| *H01L 29/66* | (2006.01) |

(52) U.S. Cl.
CPC ........ *H01L 29/407* (2013.01); *H01L 29/0615* (2013.01); *H01L 29/404* (2013.01); *H01L 29/66712* (2013.01); *H01L 29/7811* (2013.01); *H01L 29/0696* (2013.01)

(58) Field of Classification Search
CPC ............. H01L 29/407; H01L 29/66712; H01L 29/7811

USPC .......................................................... 257/329
See application file for complete search history.

(56) References Cited

U.S. PATENT DOCUMENTS

| | | | |
|---|---|---|---|
| 7,652,325 B2 | 1/2010 | Siemieniec et al. | |
| 7,652,352 B2 | 1/2010 | Cho et al. | |
| 8,558,308 B1 | 10/2013 | Blank | |
| 8,618,598 B2 | 12/2013 | Haeberlen et al. | |
| 8,748,976 B1* | 6/2014 | Kocon | H01L 29/404 257/330 |
| 2009/0149023 A1* | 6/2009 | Koyanagi | H01L 21/76898 438/666 |
| 2016/0163804 A1* | 6/2016 | Kocon | H01L 29/404 257/329 |

FOREIGN PATENT DOCUMENTS

| | | |
|---|---|---|
| DE | 10007415 C2 | 1/2002 |
| DE | 102005052734 B4 | 2/2012 |
| DE | 102014112379 A1 | 3/2016 |

* cited by examiner

*Primary Examiner* — Sue A Purvis
*Assistant Examiner* — Thai T Vuong
(74) *Attorney, Agent, or Firm* — Murphy, Bilak & Homiller, PLLC

(57) ABSTRACT

An embodiment of a semiconductor device includes a transistor cell array having transistor cells in a semiconductor body. A planar gate structure is on the semiconductor body at a first side. Field electrode trenches extend into the semiconductor body from the first side. Each of the field electrode trenches includes a field electrode structure. A depth d of the field electrode trenches is greater than a maximum lateral dimension wmax of the field electrode trenches at the first side.

24 Claims, 19 Drawing Sheets

SEMICONDUCTOR DEVICE COMPRISING PLANAR GATE AND TRENCH FIELD ELECTRODE STRUCTURE

BACKGROUND

In semiconductor devices such as semiconductor power insulated gate field effect transistors (IGFETs), for example metal oxide semiconductor field effect transistors (MOSFETs) static and dynamic losses have an impact on device performance. Whereas a drain-to-source on-state resistance (Rdson), drain-source and gate-source leakage currents (IDSS, IGSS) typically contribute to the static losses, input and output capacitances determined by device specific capacitances such as gate-to-drain capacitance ($C_{GD}$), gate-to-source capacitance ($C_{GS}$) and drain-to-source ($C_{DS}$) as well as a gate resistance typically contribute to the dynamic losses.

It is desirable to improve both static and dynamic losses of a semiconductor device.

SUMMARY

The present disclosure relates to a semiconductor device comprising a transistor cell array. The transistor cell array comprises transistor cells in a semiconductor body. A planar gate structure is on the semiconductor body at a first side. Field electrode trenches extend into the semiconductor body from the first side. Each of the field electrode trenches comprises a field electrode structure. A depth d of the field electrode trenches is greater than a maximum lateral dimension wmax of the field electrode trenches at the first side.

The present disclosure also relates to a method of forming a semiconductor device. The method comprises forming field electrode trenches extending into a semiconductor body from a first side. A depth d of the field electrode trenches is greater than a maximum lateral dimension wmax of the field electrode trenches at the first side. The method further comprises forming a field electrode structure in the field electrode trenches. The method further comprises forming a planar gate electrode on the semiconductor body at a first side. The method further comprises forming a source region in the semiconductor body by ion implantation of dopants self-aligned to the gate electrode and the field electrode structure constituting an ion implantation mask.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

Figure 1A:
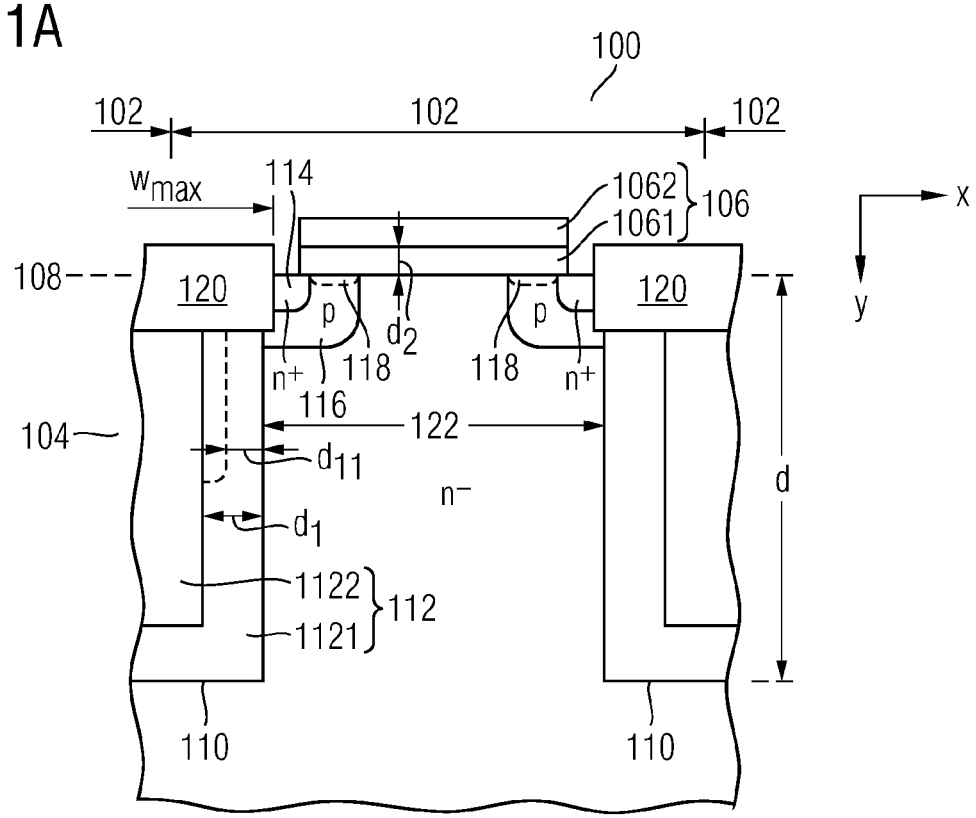
FIG. 1A is a schematic cross-sectional view of a semiconductor device including field electrode trenches and a planar gate structure.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s)

adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

The semiconductor device may have terminal contacts such as contact pads (or electrodes) which allow electrical contact to be made with the integrated circuits or secrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

An embodiment of a semiconductor device is illustrated in the schematic cross-sectional view 100 of FIG. 1A.

The semiconductor device includes a transistor cell array comprising transistor cells 102 in a semiconductor body 104. The semiconductor device 100 further includes a planar gate structure 106 on the semiconductor body 104 at a first side 108. Field electrode trenches 110 extend into the semiconductor body 104 from the first side 108. Each of the field electrode trenches 110 comprises a field electrode structure 112. A depth d of the field electrode trenches 110 is greater than a maximum lateral dimension wmax of the field electrode trenches 110 at the first side 108.

The planar gate structure 106 includes a gate dielectric 1061 and a gate electrode 1062. The gate dielectric 1061 may include one or more insulating layer(s) such as oxide(s), for example SiO$_2$, nitride(s), for example Si$_3$N$_4$, high-k dielectric(s) and low-k dielectric(s). The gate electrode 1062 may include one or more conductive layer(s) such as metal(s) and highly doped semiconductor(s), for example highly doped polysilicon. In the embodiment illustrated in FIG. 1A, the gate electrode 1062 is continuous between neighboring field electrode trenches 110 along a lateral direction x. In some other embodiments, the gate electrode 1062 of the gate electrode structure 106 is split and includes first and second gate electrode parts spaced from one another along the lateral direction x between neighboring two of the field electrode trenches 110.

The field electrode structure 112 includes a field dielectric 1121 and a field electrode 1122. The field dielectric 1121 may include one or more insulating layer(s) such as oxide(s), for example SiO$_2$, nitride(s), for example SiN$_3$, high-k dielectric(s) and low-k dielectric(s). The field electrode may include one or more conductive material(s) such as metal(s) and highly doped semiconductor(s), for example highly doped polysilicon. Typically, a thickness d$_1$ of the field dielectric 1121 is greater than a thickness d$_2$ of the gate dielectric 1061. In the embodiment illustrated in FIG. 1A, the field electrode 1122 is a single field electrode. In some other embodiments, the field electrode 1122 may include more than one, for example two, three, four or even more field electrode parts consecutively arranged along a vertical direction y perpendicular to the first side 108. In some embodiments, a thickness of the field dielectric 1121 varies along the vertical direction. In some embodiments including a plurality of field electrode parts, each field electrode part may have a different thickness of the field dielectric 1121 sandwiched between a respective one of the field electrode parts and the semiconductor body 104. In some embodiments, the field electrode parts are electrically isolated from each other. The field electrode parts may be electrically coupled to different voltages by a voltage divider, for example. The voltage divider may include resistor(s) and/or diode(s) for example and may be formed within and/or outside the semiconductor body, for example.

Source and body regions 114, 116 of opposite conductivity type are formed in the semiconductor body 104 at the first side 108. In a channel portion 118 of the body region 116 adjoining the gate dielectric 1061 at the first side 108, a conductive channel may be turned on and off by altering a voltage applied to the gate electrode 1062.

In the embodiment illustrated in FIG. 1A, a contact structure 120 electrically connected to the field electrodes 1122 extends into the semiconductor body 104 at the first side 108. The source regions 114 and the body regions 116 of the transistor cells 102 are electrically connected to sidewalls of the contact structure 120 in the semiconductor body 104.

Figure 1B:
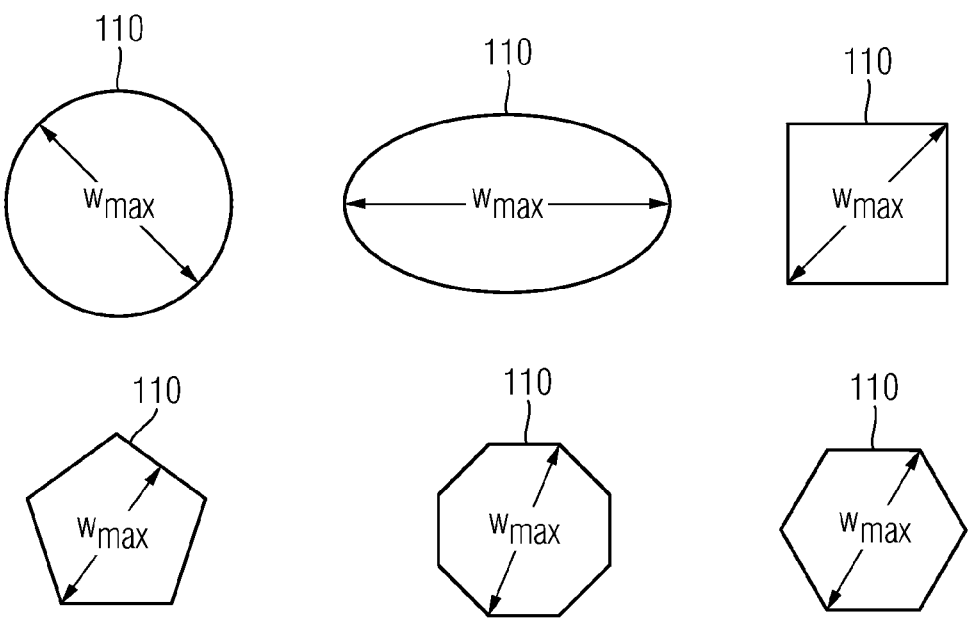
FIG. 1B is a schematic top view illustrating embodiments of shapes of the field electrode trenches at a first side of a semiconductor body.

Embodiments of shapes of the field electrode trenches 110 at the first side 108 are illustrated in the schematic top views of FIG. 1B. In some embodiments, a shape of the field electrode trenches 110 at the first side 108 is at least one of circular, elliptical and polygonal. The maximum lateral dimension of the field electrode trenches 110 in the different embodiments illustrated in FIG. 1B is denoted by wmax.

The field electrode trenches 110 provide a technical benefit of enabling an increased mesa area for current flow while maintaining lateral charge compensation. This contributes to a further reduction of a resistance in a current path between drain and source, and hence to a further reduction of Rdson. The planar gate structure 106 not only allows for a simplified manufacturing process flow and layout, but also provides a lateral channel which is beneficial with regard to low gate-to-drain capacitance C$_{GD}$.

A gate resistance can be tuned to application requirements in view of flexibility in choosing a thickness of the gate electrode 1062, layout and material composition. Since the gate electrode 1062 is located at the top of a mesa region 122 and the gate electrode may also be split into sections, the gate-to-drain capacitance C$_{GD}$ may be further reduced.

Moreover, the body and source regions 116, 114 may be formed by self-aligned ion implantations with respect to the gate electrode 1062 which is beneficial in narrowing a gate-to-source threshold voltage distribution. A doping concentration profile of the mesa region 122 as well as the semiconductor body 104 below the field electrode trenches 110 may be adapted to compensate for segregation or JFET effects, for example. A field stop layer having a higher doping concentration than a drift zone adjoining a bottom side of the body region 116 may be arranged between the drift zone and a second side of the semiconductor body 104 opposite to the first side. The semiconductor body 104 may also include multiple epitaxial layers on a semiconductor substrate, wherein a doping concentration of the epitaxial layers gradually increase from an outermost of the epitaxial layers to the semiconductor substrate. Moreover, lifetime controlled semiconductor regions may be formed in the semiconductor body 104 for the purpose of reducing a reverse recovery charge (Qrr). In some embodiments, the lifetime controlled semiconductor regions include platinum (Pt). In some embodiments, a net doping concentration the mesa region 122 is reduced in a first part between the gate dielectric 1061 and a reference level above or below a bottom side of the body regions 116, for example by counter-doping of the first part while leaving a second part of the mesa region 122 below the first part unchanged. Counter-doping in case of an n-doped mesa region may be achieved by introducing p-type dopants into the first part, for example by ion implantation and/or diffusion, in an amount that allows for partly compensating the n-type dopants in the first part. A reduction of the net doping concentration in the first or upper part of the mesa region 122 adjoining the gate dielectric 1061 provides the technical benefit of reduction of the gate-to-drain capacitance C$_{GD}$. In some embodiments, a net doping concentration of the mesa region 122 is increased in the first part between the gate dielectric 1061 and the reference level above or below the bottom side of the body regions 116. An increase of the net doping concentration in the first or upper part of the mesa region 122 adjoining the gate dielectric 1061 provides the technical benefit of reduction of a JFET effect originating from space charge regions extending from opposite body regions 116 within one mesa region leading to a reduction of the negative impact on the drain-to-source on-state resistance (Rdson) due to the planar channel structure.

The field dielectric 1121 may also be tapered, for example by having a lower field dielectric segment with a thickness d$_1$ and an upper field dielectric segment with a thickness d$_{11}$. A dashed line in the schematic cross-sectional view of FIG. 1A illustrates an interface between the field dielectric 1121 and the field electrode 1122 in an upper part of the field electrode trench 110. In some embodiments, upper and lower parts of the field electrode 1122 may also have a high resistive or insulating layer in between, such that the lower part of the field plate 1122 has a high resistive or capacitive coupling to source which may be advantageous for damping a turn-off overshoot.

Figure 2A:
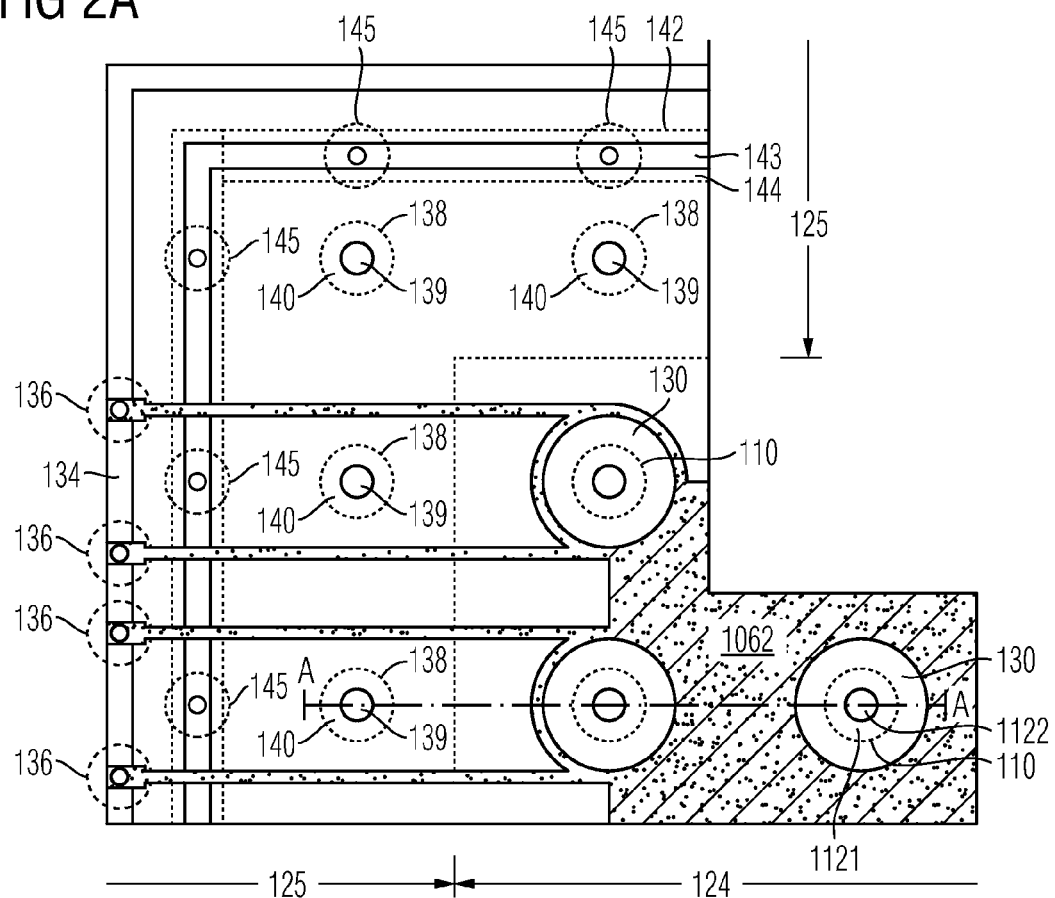
FIG. 2A is a schematic top view illustrating parts of a transistor cell array and an edge termination area of a semiconductor device having a continuous gate electrode running around field electrode trench contacts.

FIG. 2A illustrates a top view of some embodiments of a semiconductor device having a continuous gate electrode 1062 between neighboring field electrode trenches 110 in a transistor cell array 124. An edge termination area 125 surrounds the transistor cell array 124.

First contacts 128 extend through first openings 130 in the gate electrode 1062 and are electrically connected to the field electrodes 1122 in the field electrode trenches 110 and are also electrically connected to the body and source regions 116, 114. In the embodiment illustrated in FIG. 1A, the gate electrode 1062 is continuous in the transistor cell array 124 and is, apart from the first openings 130, absent of other openings in the transistor cell array 124.

A gate wire 132 made of one or a plurality of conductive materials electrically connects the gate electrode 1062 to a gate runner 134 running around the transistor cell array 124 for providing a plurality of gate electrode interconnection points 136.

In the edge termination area 125 junction termination structures are placed for reducing an electric field peak at a periphery of the transistor cell array 124. In the embodiment illustrated in FIG. 2A, the junction termination structures may include a plurality of junction termination trenches 138 comprising junction termination trench electrodes 139 electrically isolated from a surrounding part of the semiconductor body 104 by junction termination trench dielectrics 140. In FIG. 2A, one line of termination trenches 138 runs around the transistor cell array 124. In some other embodiments, more than one line of termination trenches 138, for example, two, three, four or even more lines of termination trenches 138 runs around the transistor cell array 124. In the embodiment illustrated in FIG. 2A, a shape of the junction termination trenches 138 equals a shape of the field electrode trenches 110 at the first side 108. In some other embodiments, the shape of the junction termination trenches 138 differs from the shape of the field electrode trenches 110 at the first side 108. In some other embodiments, additional or alternative structural elements of junction termination structures are arranged in the edge termination area 125. Typical structural elements of additional or alternative junction termination structures include one or more of field plates, ring structures such as floating guard rings or ring segments, junction termination extension (JTE) structures and variation of lateral doping (VLD) structures, for example.

An optional border trench 142 may be arranged in the edge termination area 125 running around the transistor cell area 124. A border trench electrode 143 in the border trench 142 may be electrically isolated from a surrounding part of the semiconductor body 104 by a border trench dielectric 144. At interconnection points 145, the border trench electrode 143 may be electrically connected to a contact layer or electrode, for example a source electrode in a wiring area above the semiconductor body 104.

Figure 2B:
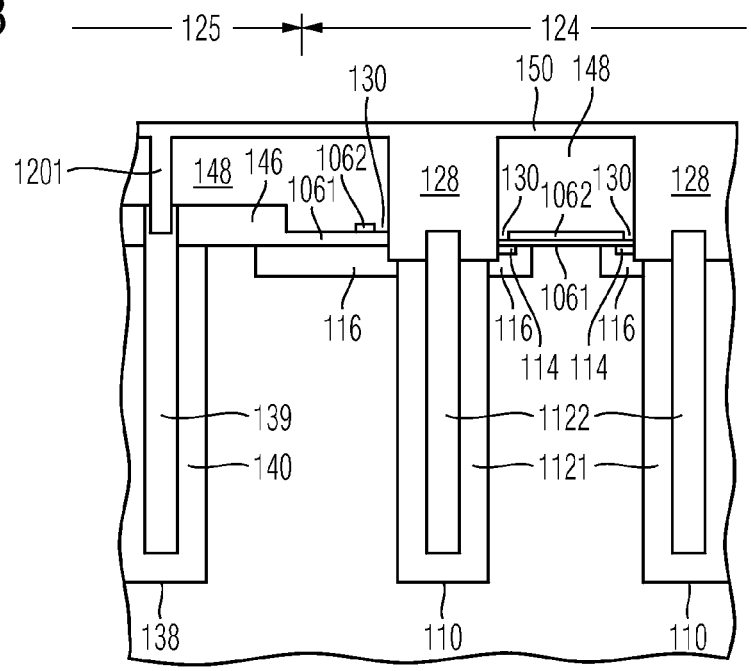
FIG. 2B illustrates one embodiment of a cross-sectional view of the semiconductor device of FIG. 2A along line A-A'.

An embodiment of a cross-sectional view of the semiconductor body 104 along line A-A' of FIG. 2A is illustrated in FIG. 2B. The gate electrode 1062 includes a single gate electrode part between neighboring two of the field electrode trenches 110. Around a border between the transistor cell array 124 and the edge termination area 125 the gate dielectric 1061 and a field isolation layer 146 merge. A thickness of the field isolation layer 146 is greater than a thickness of the gate dielectric 1061. An interlayer dielectric 148 is arranged on the gate electrode 1062 and on the field isolation layer 146 for electrically isolating wirings from the semiconductor body 104.

The first contacts 128 provide an electrical connection between the field electrodes 1122 and the source and body regions 114, 116 on the one side and a source electrode 150 on the other side. The source electrode 150 may be part of a patterned wiring layer, for example part of a patterned metallization layer. The source electrode 150 is also electrically connected to the junction termination trench electrode 139 via a contact 1201.

Figure 2C:
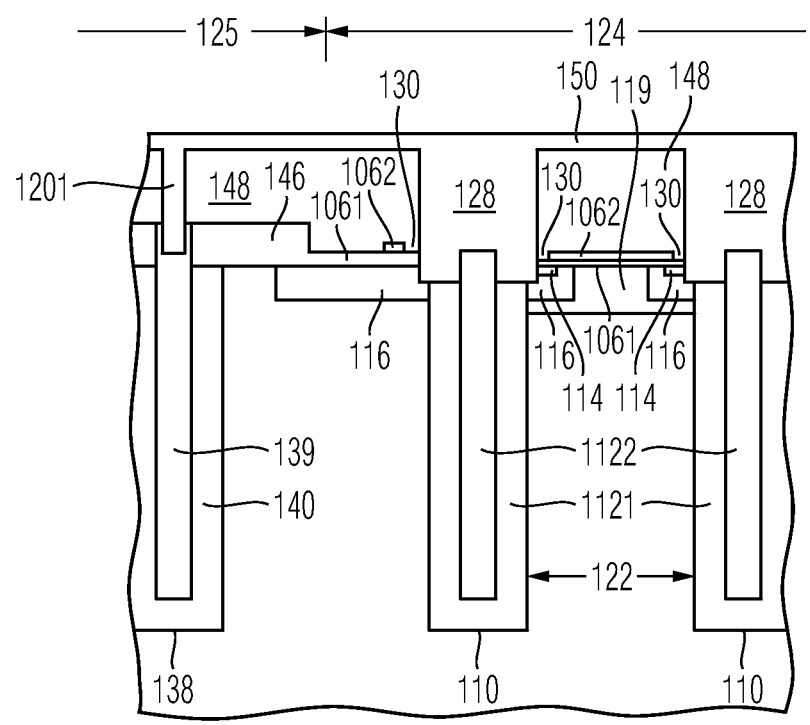
FIG. 2C illustrates another embodiment of a cross-sectional view of the semiconductor device of FIG. 2A along line A-A'.
Figure 3A:
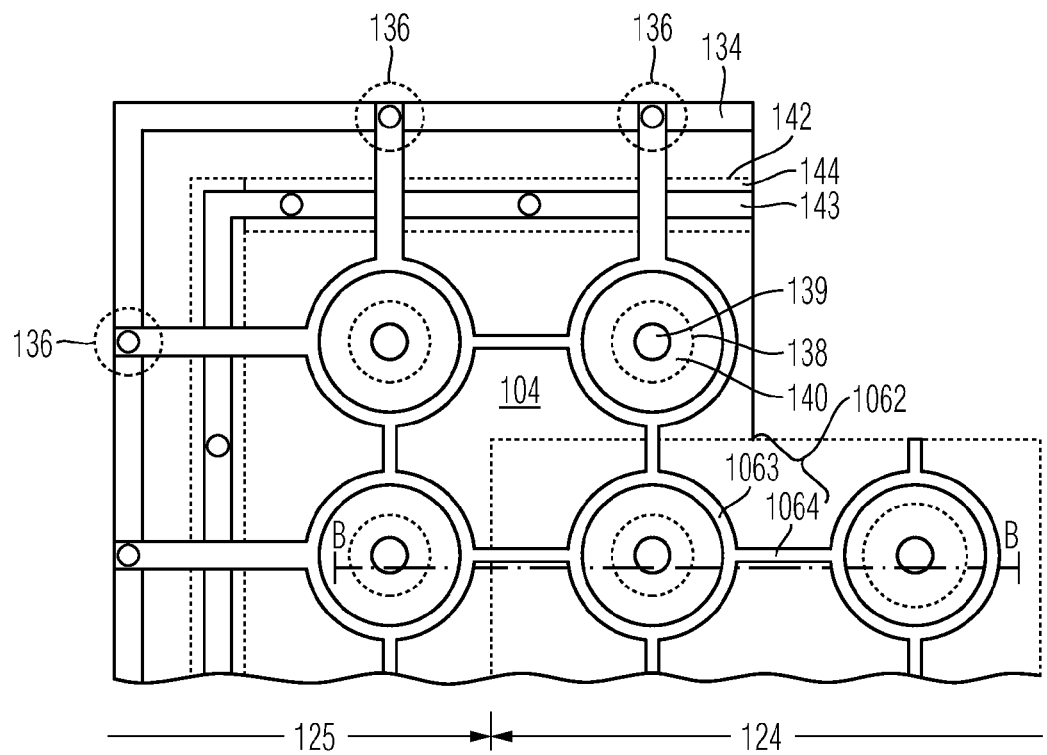
FIG. 3A is a schematic top view illustrating parts of a transistor cell array and an edge termination area of a semiconductor device having split gate electrode parts between field electrode trenches.

Another embodiment of a cross-sectional view of the semiconductor body 104 along line A-A' of FIG. 2A is illustrated in FIG. 2C. An auxiliary doped region 119 is arranged in a first part of the mesa region 122 between the gate dielectric 1061 and a reference level above or below a bottom side of the body regions 116. In the embodiment illustrated in FIG. 2C, the reference level is below the bottom side of the body regions 116. In some embodiments, a net doping concentration in the auxiliary doped region 119 is smaller than in a part of the mesa region 122 below the auxiliary doped region 119. The auxiliary doped region 119 may be formed by, for example counter-doping of the mesa region 122. Counter-doping in case of an n-doped mesa region may be achieved by introducing p-type dopants into the auxiliary doped region 119, for example by ion implantation and/or diffusion, in an amount that allows for partly compensating the n-type dopants in the auxiliary doped region 119. A reduction of the net doping concentration in the auxiliary doped region 119 or upper part of the mesa region 122 adjoining the gate dielectric 1061 provides the technical benefit of reduction of the gate-to-drain capacitance $C_{GD}$. In some embodiments, a net doping concentration in the auxiliary doped region 119 is greater than in a part of the mesa region 122 below the auxiliary doped region 119. An increase of the net doping concentration in the auxiliary doped region 119 of the mesa region 122 provides the technical benefit of reduction of a JFET effect originating from space charge regions extending from opposite body regions 116 within one mesa region and leading to a reduction of the negative impact on the drain-to-source on-state resistance (Rdson) due to the planar channel structure.

a. FIG. 3A illustrates a top view of another embodiment of a semiconductor device including split gate electrode parts. The gate electrode 1062 includes first sections 1063, each of the first sections 1063 running around a corresponding one of the first contacts 128, and second sections 1064, each of the second sections 1064 interconnecting two or more of the first sections 1063.

Figure 3B:
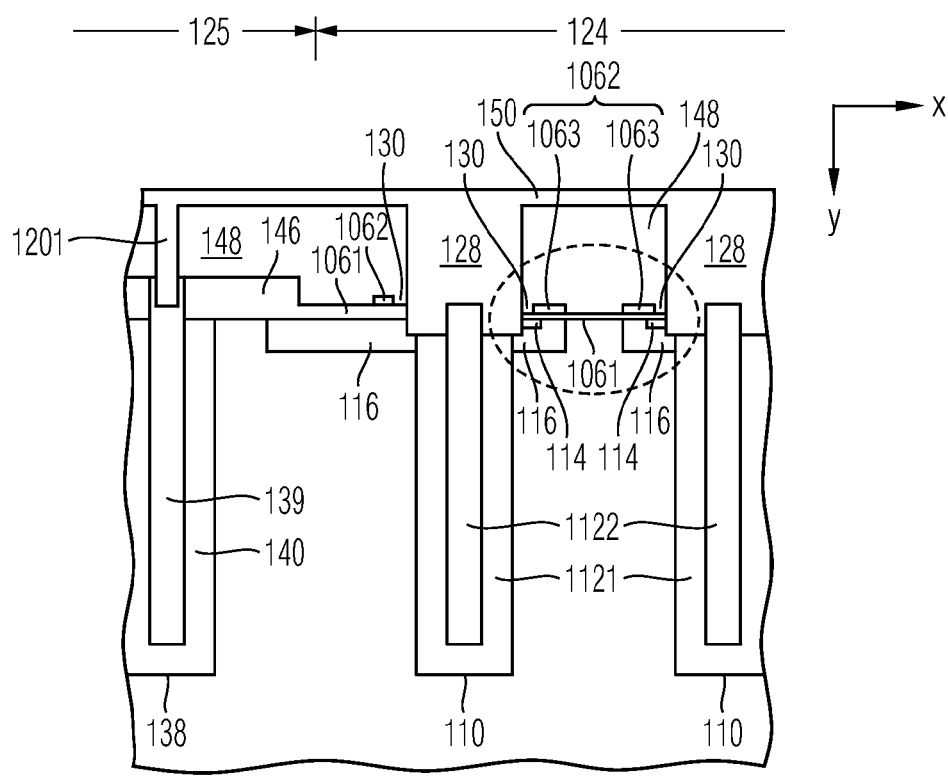
FIG. 3B illustrates one embodiment of a cross-sectional view of the semiconductor device of FIG. 3A along line B-B'.

The schematic cross-sectional view illustrated in FIG. 3B is one embodiment of a cross-section along line B-B' of FIG. 3A. The gate electrode 1062 includes first and second gate electrode parts 1063 spaced from one another along the lateral direction x between neighboring two of the field electrode trenches 110. Splitting of the gate electrode 1062 into the first and second gate electrode parts 1063 enables a further reduction of the gate-to-drain capacitance $C_{GD}$. In the embodiment illustrated in FIG. 3B, the first and second gate electrode parts 1063 spaced from one another are electrically connected to the gate runner 134 illustrated in FIG. 3A.

Figure 3C:
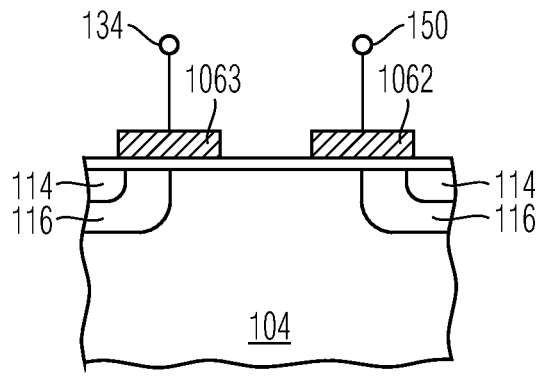
FIGS. 3C and 3D illustrate embodiments of cross-sectional views of the split gate electrode parts between field electrode trenches.
Figure 3D:
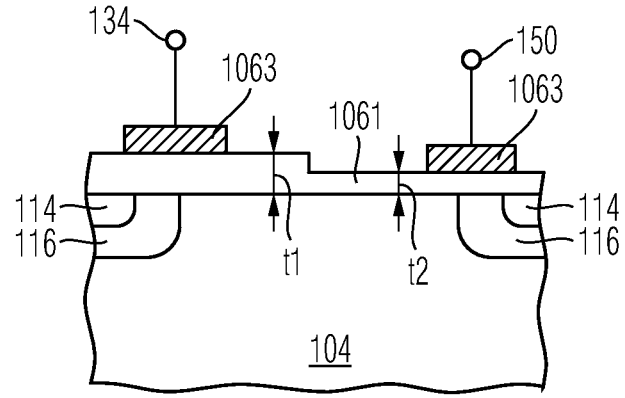

Other embodiments of interconnecting the first and second gate electrode parts 1063 are illustrated in the schematic cross-sectional views of FIGS. 3C and 3D. Referring to FIG. 3C, one of the first and second gate electrode parts 1063 may be electrically connected to the gate runner 134 and the other one of the first and second gate electrode parts 1063 may be electrically connected to the source electrode 150. This interconnection scheme may be beneficial with regard to high-speed switching applications.

As is illustrated in the schematic cross-sectional view of FIG. 3D, a thickness $t_1$ of the one of the first and second gate electrode parts 1063 electrically connected to the gate runner 134 is greater than a thickness $t_2$ of the other one of the first and second gate electrode parts 1063 electrically connected to the source electrode 150. The other one of the first and second gate electrode parts 1063 electrically connected to the source electrode 150 acts as a metal oxide semiconductor (MOS) gated diode offering a low forward-bias voltage VF at a reference current.

Figure 4A:
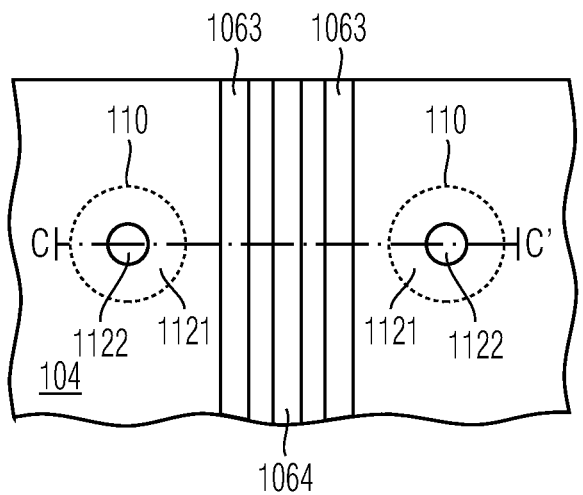
FIG. 4A is a schematic top view illustrating parts of a transistor cell array and an edge termination area of a semiconductor device having stripe-shaped gate electrode parts between field electrode trenches.

FIG. 4A is a top view of some embodiments of a semiconductor device having stripe-shaped gate electrode parts 1063 between field electrode trenches 110. A second contact 1065 to the source and body regions 114, 116 is located between the first and second gate electrode parts 1063.

Figure 4B:
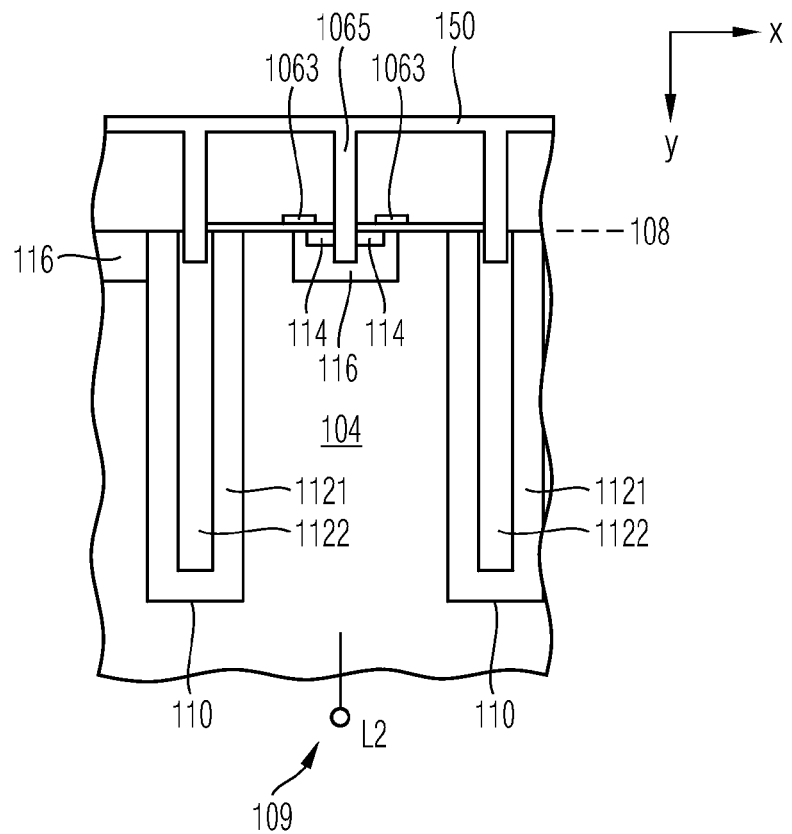
FIG. 4B illustrates one embodiment of a cross-sectional view of the semiconductor device of FIG. 4A along line C-C'.

An embodiment of a cross-sectional view of the semiconductor body 104 along line C-C' of FIG. 4A is illustrated in FIG. 4B.

Different from the embodiment illustrated in FIG. 2B, the source and body regions 114, 116 are electrically connected to the source electrode 150 via a second contact 1065 extending into the semiconductor body 104 at the first side 108. The source and body regions 114, 116 are arranged between the first and second gate electrode parts 1063 along the lateral direction x.

In some embodiments, the semiconductor device is a vertical insulated gate field effect transistor comprising a first load electrode, for example the source electrode 150 at the first side 108 and a second load electrode L2 at a second side 109 opposite to the first side 108.

Figure 5:
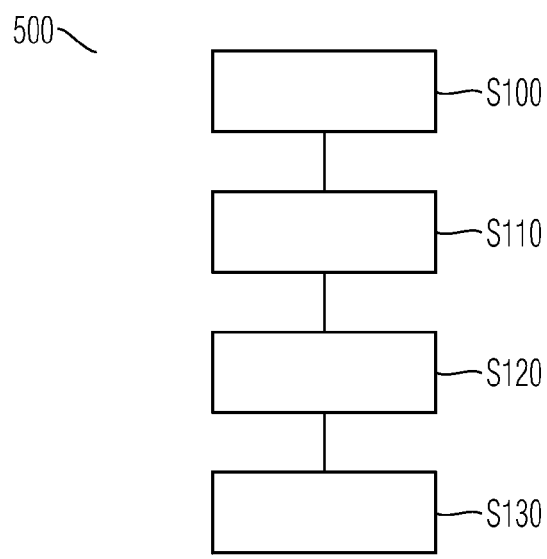
FIG. 5 is a flow diagram of an embodiment of a method of manufacturing a semiconductor device including field electrode trenches and a planar gate structure.

FIG. 5 is a schematic flow diagram for illustrating a method 500 of manufacturing a semiconductor device.

It will be appreciated that while method 500 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 includes forming field electrode trenches extending into a semiconductor body from a first side, wherein a depth d of the field electrode trenches is greater than a maximum lateral dimension wmax of the field electrode trenches at the first side.

Process feature S110 includes forming a field electrode structure in the field electrode trenches.

Process feature S120 includes forming a planar gate electrode on the semiconductor body at the first side.

Process feature S130 includes forming a source region in the semiconductor body by ion implantation of dopants self-aligned to the gate electrode and to the field electrode structure, wherein the gate electrode and the field electrode structure constitute an ion implantation mask.

In some embodiments, a contact groove is formed into the semiconductor body by removing an upper part of a field dielectric of the field electrode structure in the field electrode trenches. The contact groove may be filled with conductive material electrically connected to the source region through a sidewall of the contact groove.

In some embodiments, a body region may be formed in the semiconductor body by ion implantation of dopants self-aligned to the gate electrode and to the field electrode structure, wherein the gate electrode and the field electrode structure constitute an ion implantation mask.

The schematic cross-sectional views of the semiconductor body 104 in FIGS. 6 to 18 illustrate process features according to embodiments of manufacturing a semiconductor device.

Figure 6:
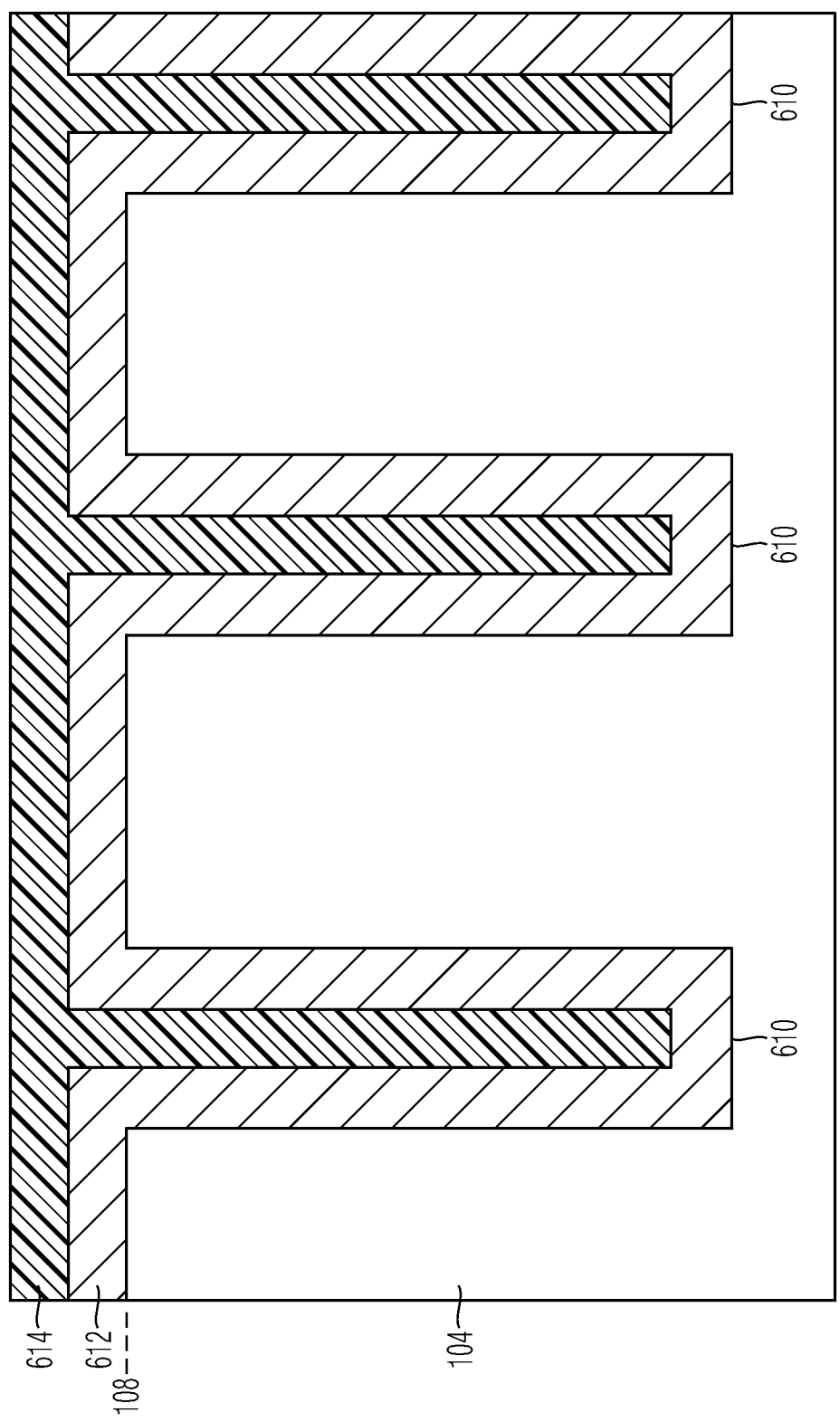
FIGS. 6 to 18 are schematic cross-sectional views of a semiconductor body for illustrating process features of embodiments of forming a semiconductor device including field electrode trenches and a planar gate structure.

Referring to the schematic cross-sectional view of FIG. 6, trenches 610 are formed in the semiconductor body by an etch process using an etch mask pattern at the first side 108. After formation of a first dielectric material 612 on the semiconductor body 104, the first dielectric material 612 lines sidewalls and a bottom side of the trenches 610 as well as a top side of the semiconductor body 104. The first dielectric material 612 may be formed by a conformal deposition process, for example by low pressure chemical vapour deposition (LPCVD) of silicon oxide or thermal oxidation. A first conductive material 614 is formed at the first side 108 in the trenches 610 on the dielectric material 612. In some embodiments, the first conductive material 614 is highly doped polycrystalline silicon deposited by CVD and/or a metallic material, for example Ti/TiN/ W. Each of the first dielectric material 612 and the first conductive material 614 may be formed of one layer or a layer stack, for example.

Figure 7:
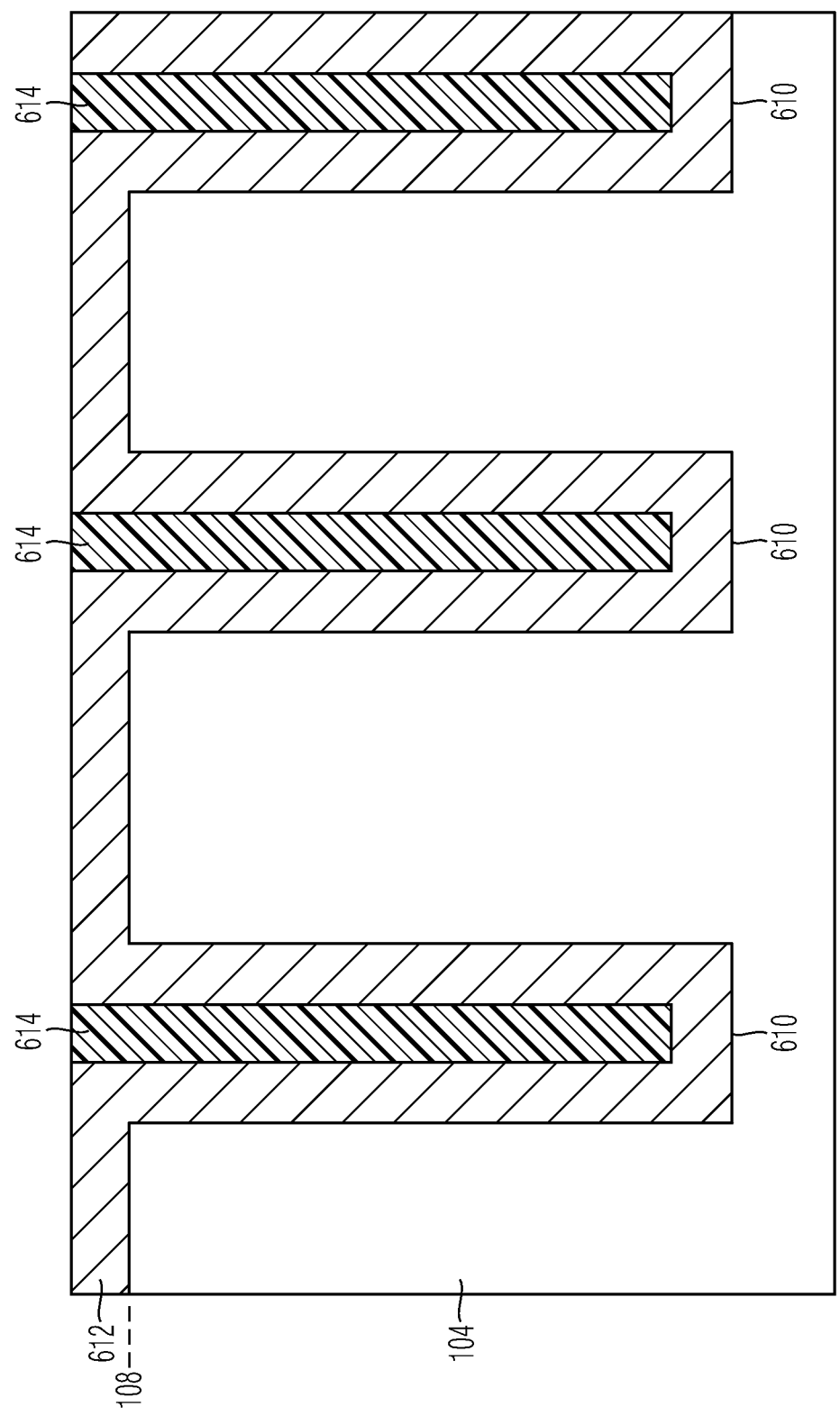

FIG. 7 is a schematic cross-sectional view of the semiconductor body 104 illustrated in FIG. 6 after removing the first conductive material 614 up to the first dielectric material 612. In some embodiments, the first conductive material 614 is removed by a chemical-mechanical polishing (CMP) process. In addition or alternatively, the first conductive material 614 may be removed by etching the first conductive material 614 up to the first dielectric material 612.

Figure 8:
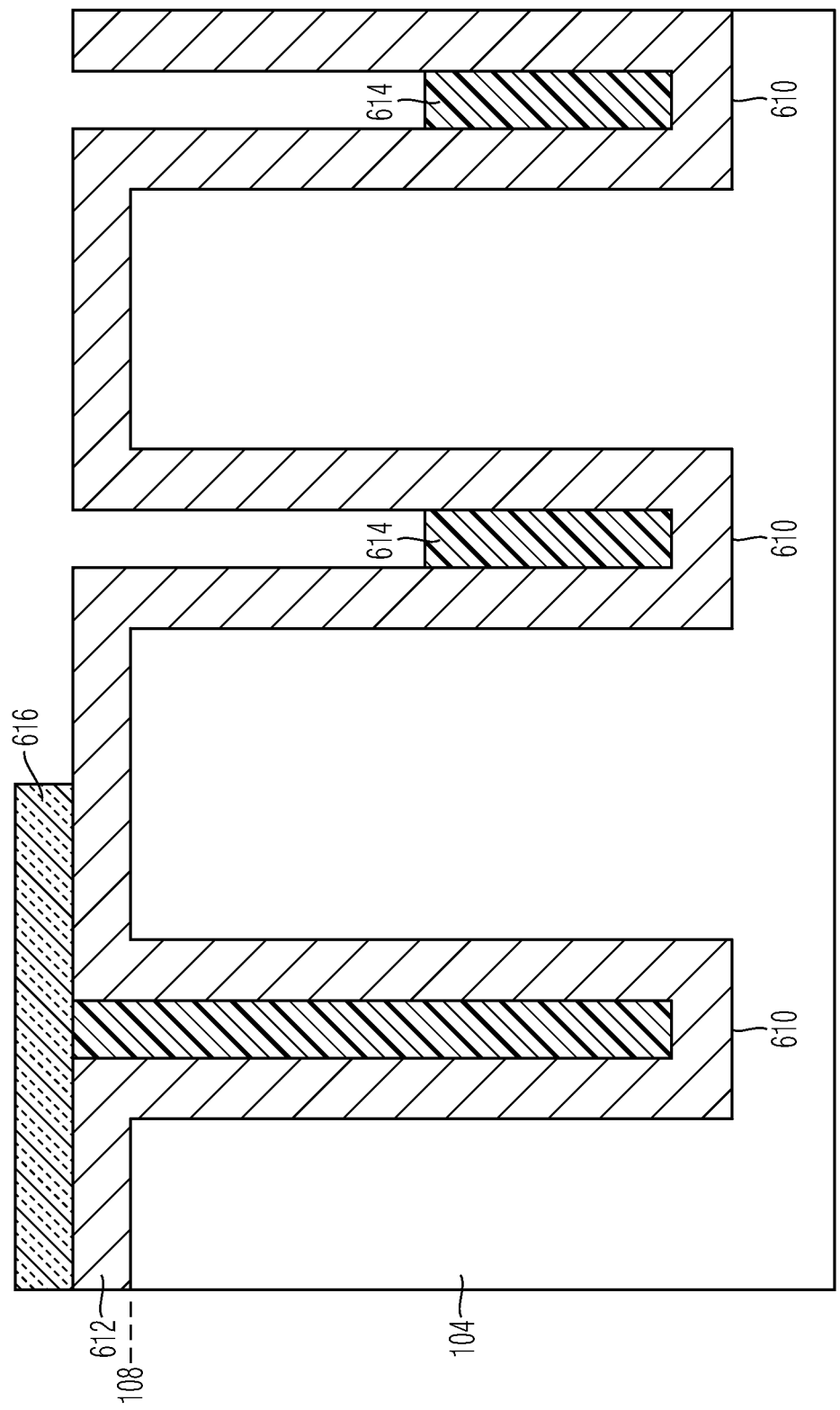

Referring to the schematic cross-sectional view of FIG. 8, a first mask 616 is formed on a part of the first dielectric material 612 at the first side 108. In some embodiments, the first mask 616 is absent in areas where a transistor cell array is to be formed, and is present in areas where junction termination trench structures are to be formed.

Figure 13:
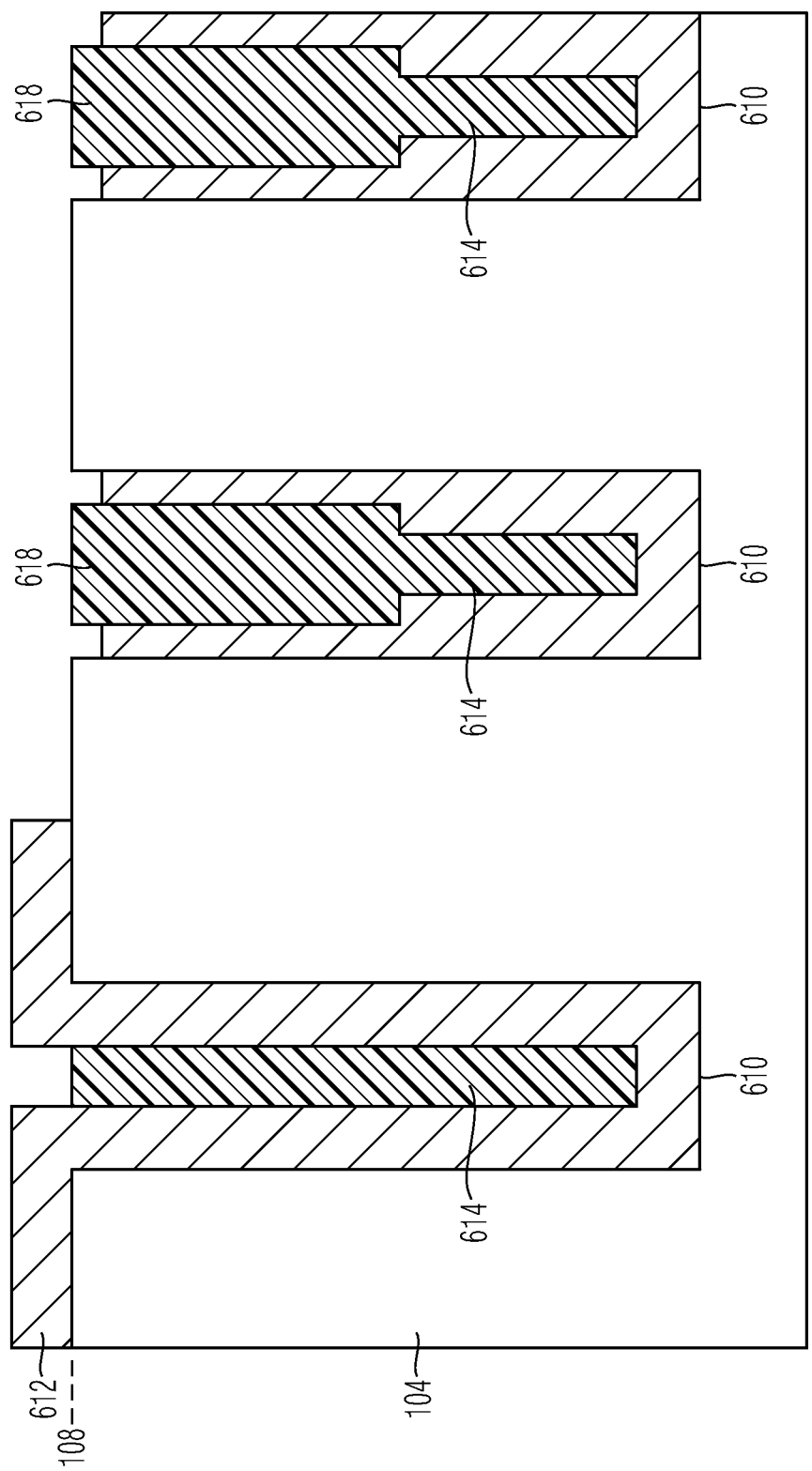
Figure 14:
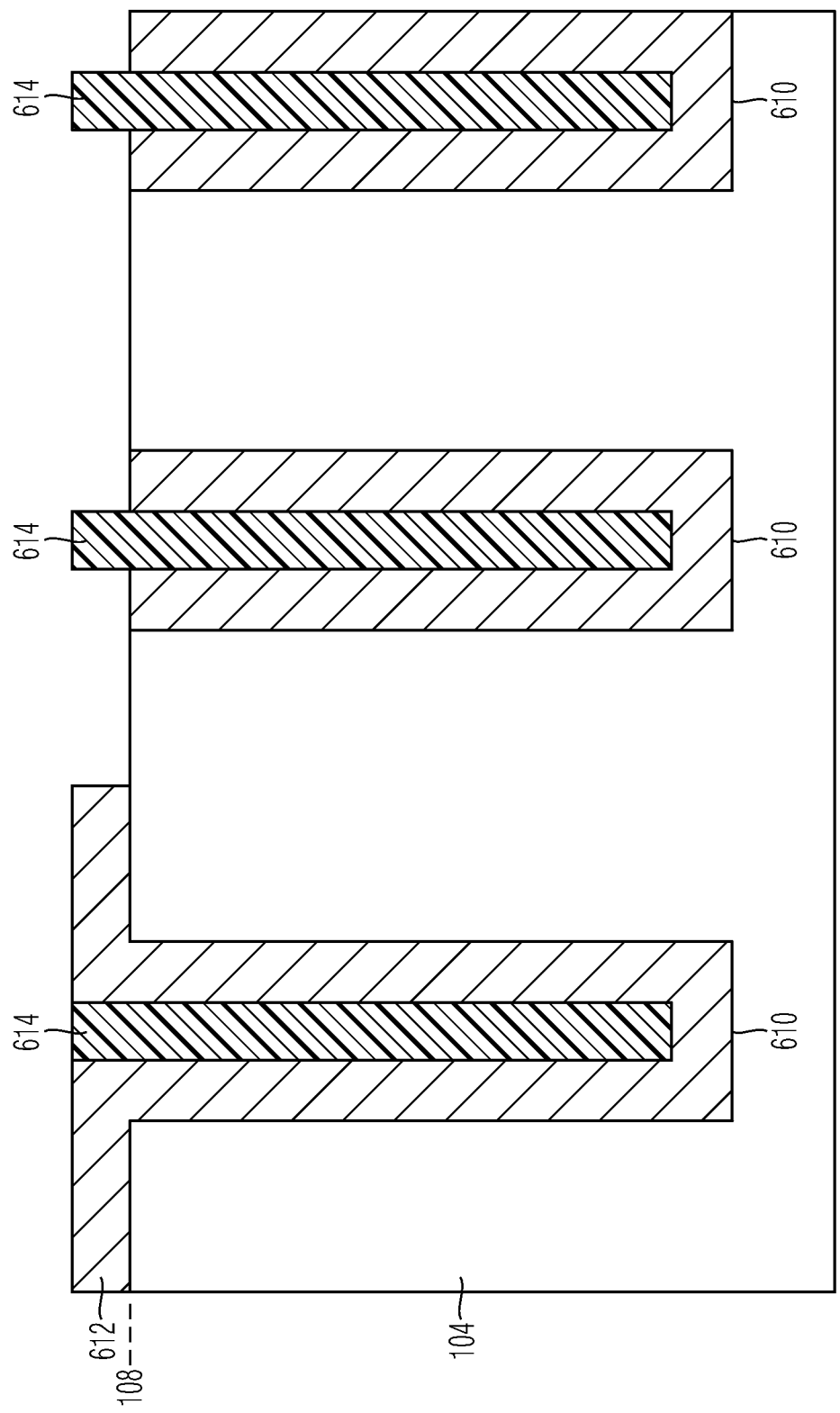

After formation of the first mask 616, manufacturing of the semiconductor device may be continued as is illustrated in the schematic cross-sectional view starting from FIG. 14. Alternatively, a tapered field electrode, as is illustrated, for example, in FIG. 1A by dashed lines, may be manufactured by processes illustrated in the schematic cross-sectional views of FIGS. 8 to 13 before continuing with processes illustrated in FIGS. 15 to 18.

After formation of the first mask 616 in FIG. 8, the first conductive material 614 is partly removed from the trenches 610, for example by an etch process.

Figure 9:
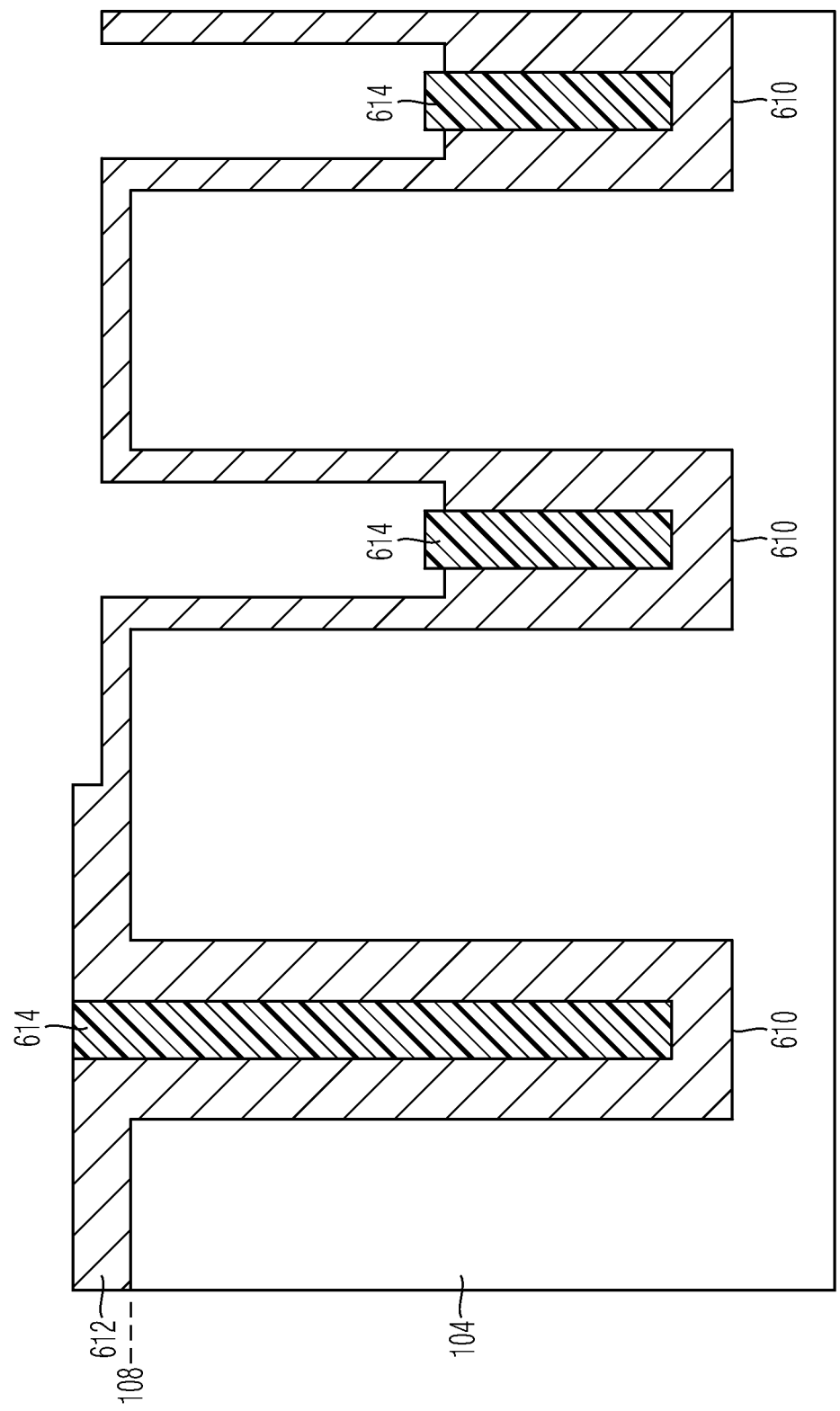

In the schematic cross-sectional view of FIG. 9, the first dielectric material 612 is at least partly removed at the first side 108. Instead of partly removing the first dielectric material 612 in unmasked parts of the semiconductor body 104, the first dielectric material 612 may also be completely removed in the unmasked parts of the semiconductor body 104 and re-formed by an appropriate process, for example by a deposition and/or growth process.

In some embodiments, a dielectric is formed on uncovered parts of the recessed first conductive material 614 in the trenches 610 for providing an electrical isolation between upper and lower field electrodes to be formed in the trenches 610.

Figure 10:
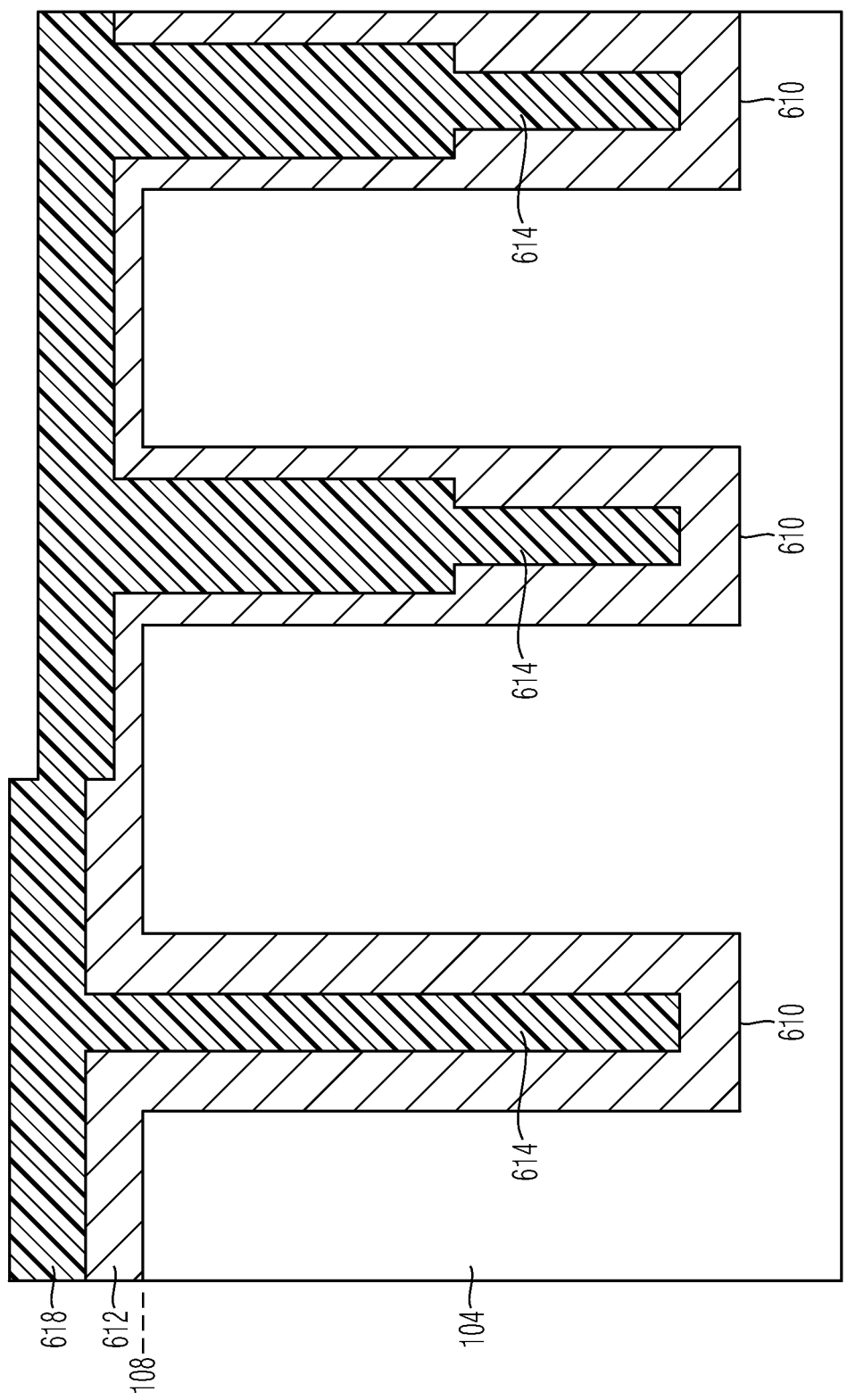

Referring to the schematic cross-sectional view of FIG. 10, a second conductive material 618 is formed in the trenches 610 that are uncovered at the first side and on the first dielectric material 612. In some embodiments, the first and second conductive materials 614, 618 correspond to each other. In some embodiments, the first and second conductive materials 614, 618 are made of highly doped polycrystalline silicon and/or a metallic layer, for example Ti/TiN/W.

Figure 11:
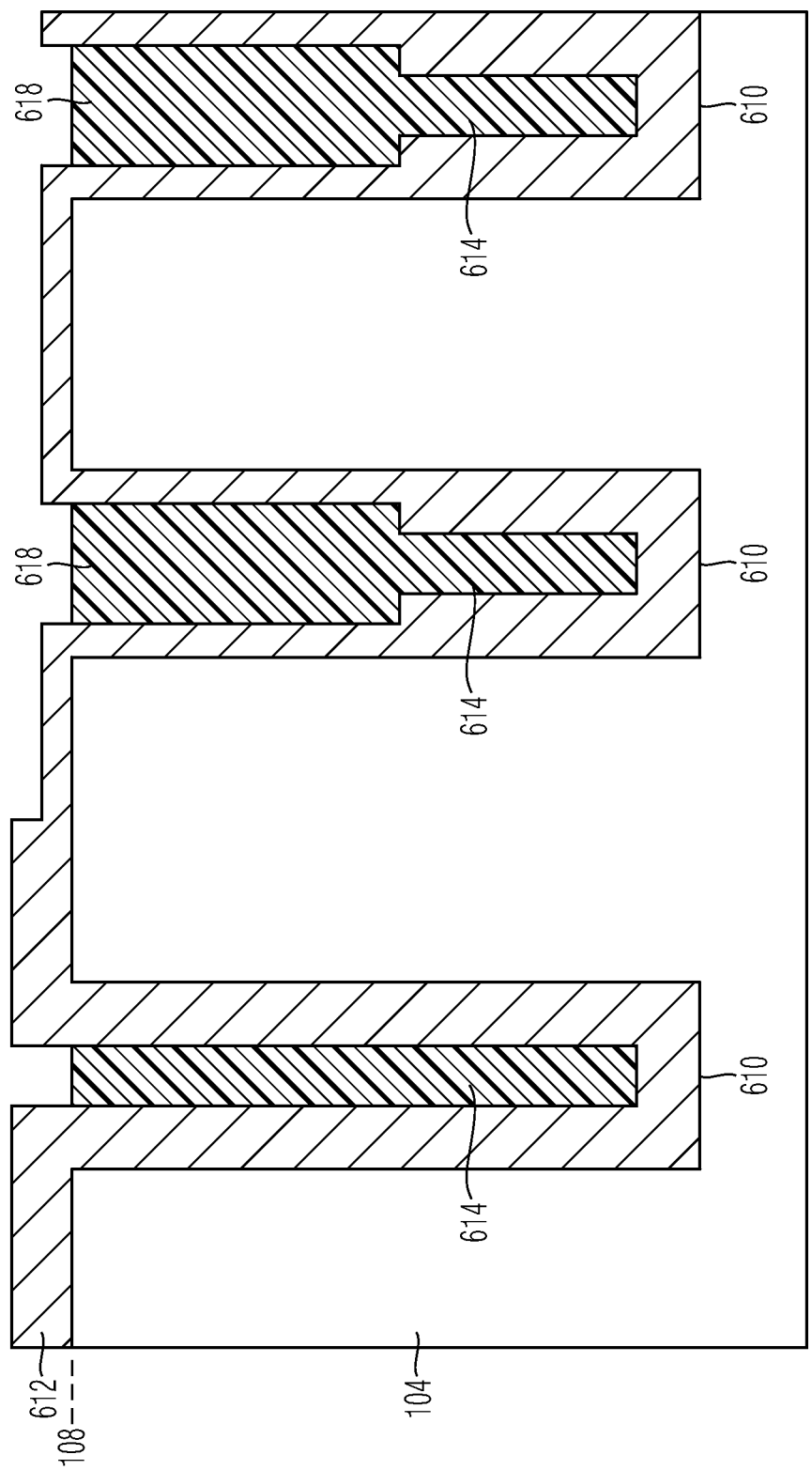

Referring to the schematic cross-sectional view of FIG. 11, the second conductive material 618 is removed at the first side 108 up to the first dielectric material 612, for example by CMP and/or etching. The second conductive material 618 in an upper part of the trenches 610 may serve as an upper field electrode part and the first conductive material 614 in a lower part of the trenches 610 may serve as a lower field electrode part of a tapered field electrode in a transistor cell array to be formed. Trenches 610 including the first conductive material 614 up to the first side 108 may serve as junction termination trenches in an edge termination area of a semiconductor device to be formed.

Figure 12:
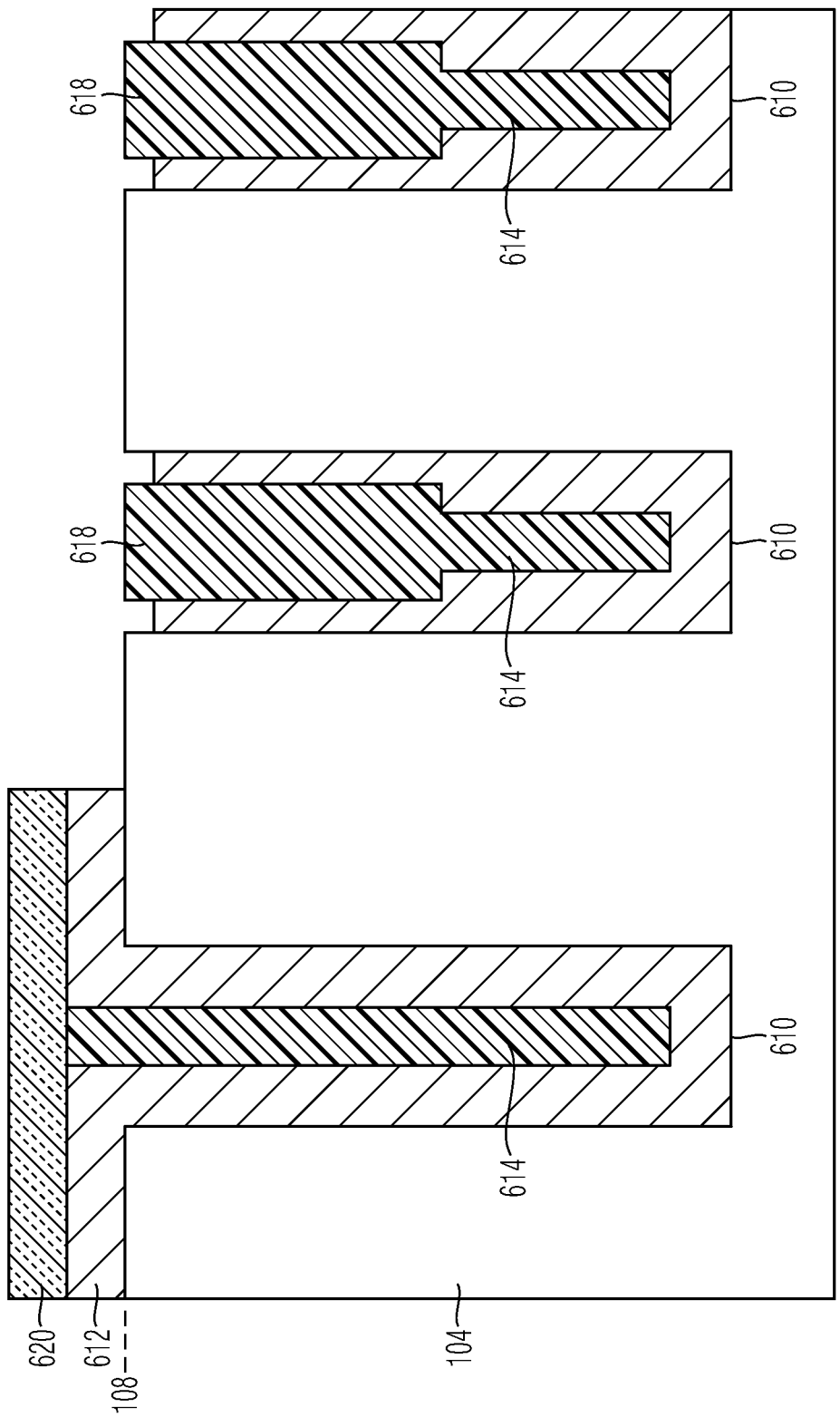

Referring to the schematic cross-sectional view of FIG. 12, a second mask 620 is formed on a part of the first dielectric material 620 at the first side 108. Then, the first dielectric material 612 is removed at the first side 108 from unmasked parts of the semiconductor body 104. In some embodiments, the second mask 620 is absent in areas where a transistor cell array is to be formed, and is present in areas where junction termination trench structures are to be formed.

Referring to the schematic cross-sectional view of FIG. 13, the second mask 620 is removed at the first side 108.

As an alternative to forming the first and second conductive materials 614, 618 in some of the trenches 610 as illustrated with regard to FIGS. 8 to 13 for the purpose of providing a tapered electrode in the trenches 610 (option I), a non-tapered or slightly tapered (due to trench processing) electrode in the trenches 610 as is illustrated in the schematic cross-sectional view of FIG. 7 (option II) may be subject to further processing of the semiconductor body 104. The semiconductor body 104 illustrated in the schematic cross-sectional view of FIG. 14 results from processing the semiconductor body 104 as is illustrated in FIG. 7 after removing parts of the first dielectric material 612 and partly exposing the semiconductor body 104 at the first side 104.

Although the process features illustrated in FIGS. 15 to 18 are based on the option I, the process features likewise apply to option II.

Figure 15:
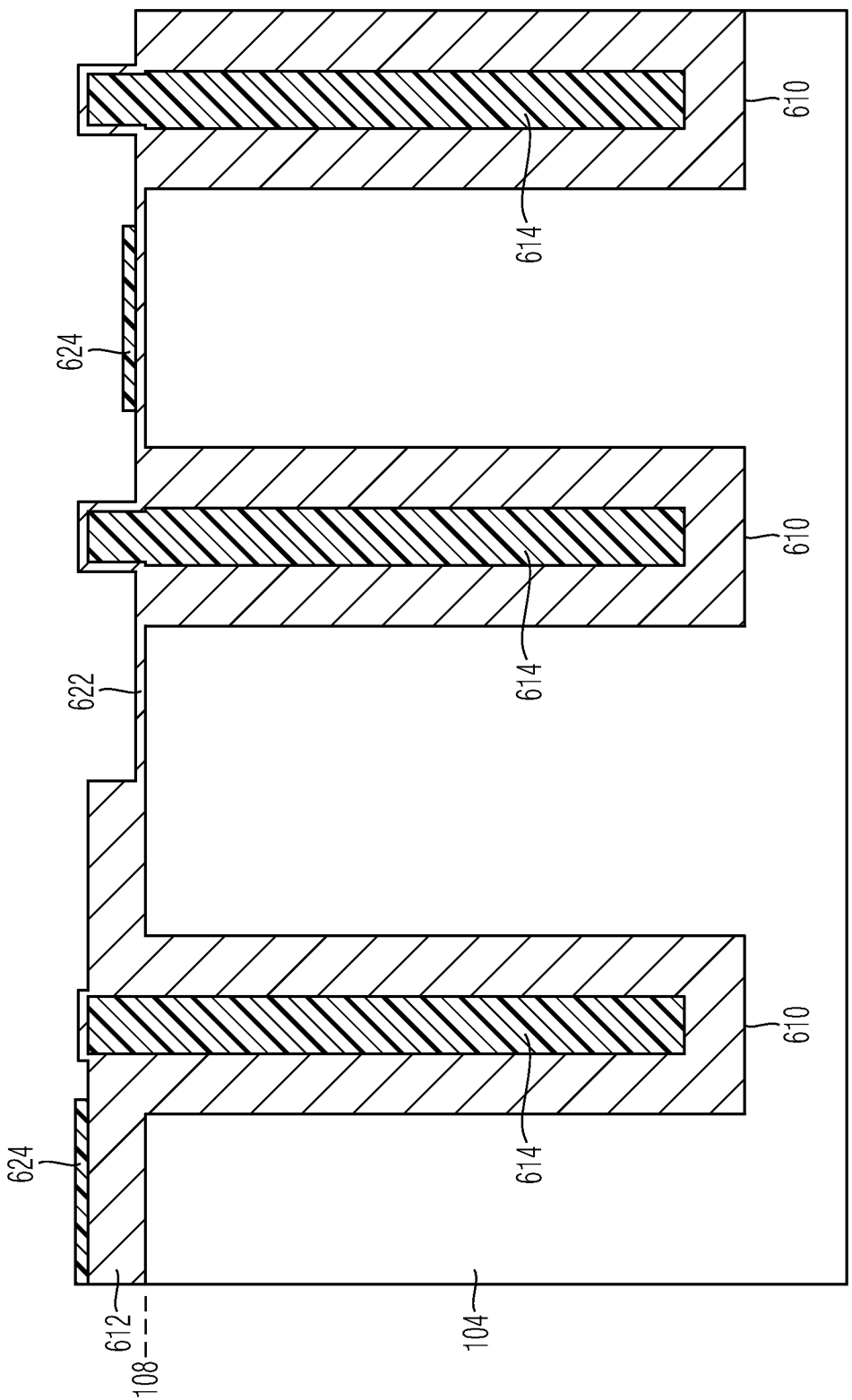

Referring to the schematic cross-sectional view of FIG. 15, a second dielectric material 622 serving as a gate dielectric in a transistor cell array is formed on the semiconductor body 104, for example by a thermal oxidation process. Then, a third conductive material 624 is formed on the second dielectric material 622 and patterned by lithography for the purpose of providing a planar gate electrode in a transistor cell array and for providing interconnection lines in a periphery of the transistor cell array, for example. In some embodiments, the third conductive material 624 includes or is made of polycrystalline silicon and/or a metallic layer.

Figure 16:
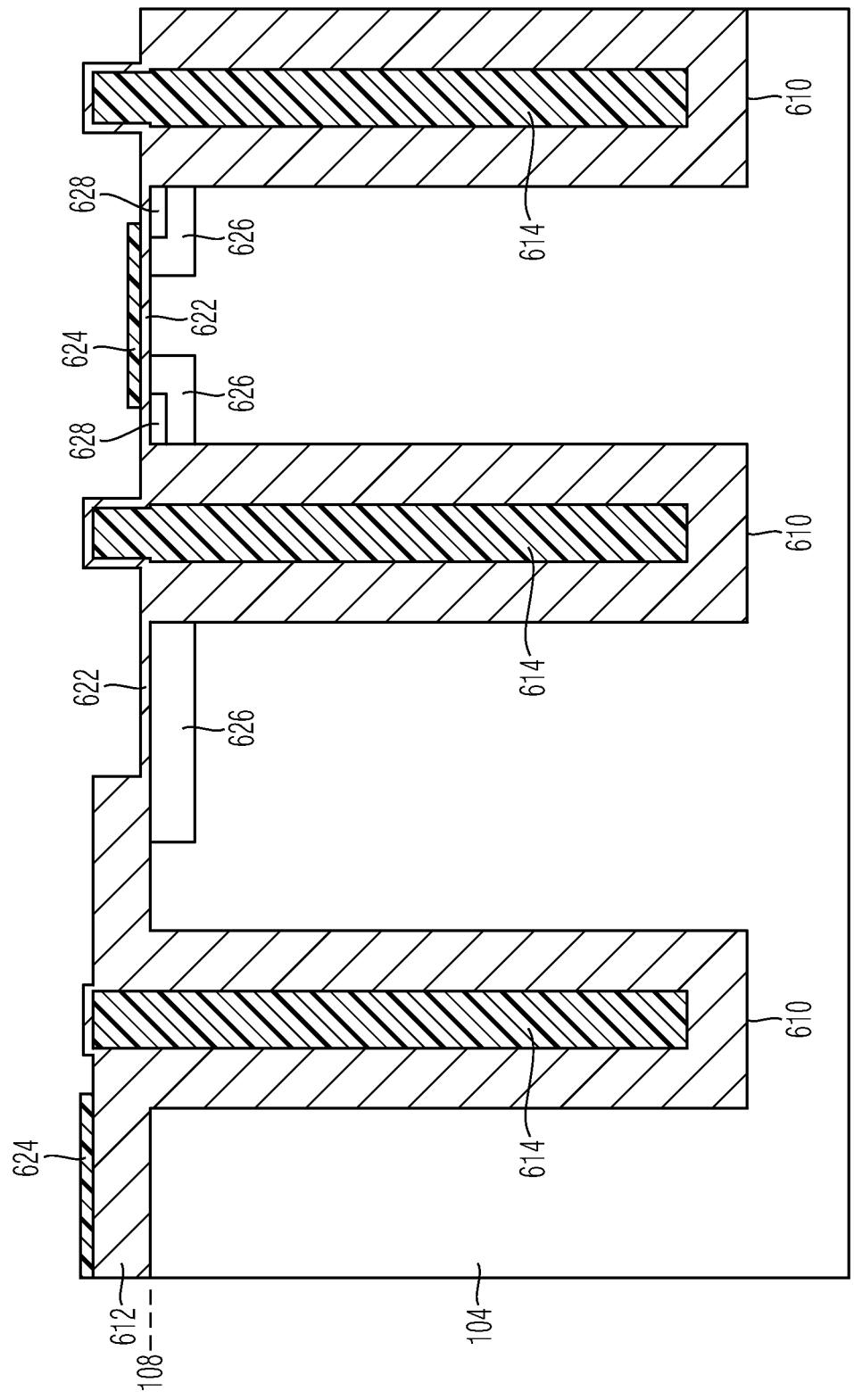

Referring to the schematic cross-sectional view of FIG. 16, ion implantation processes are carried out in a self-aligned manner with respect to the third conductive material 624 and the first dielectric material 612. First semiconductor regions 626 are formed by ion implantation of dopants of a first conductivity type for the purpose of providing body regions in a transistor cell array to be formed. Second semiconductor regions 628 are formed by ion implantation of dopants of a second conductivity type for the purpose of providing source regions in a transistor cell array to be formed. Examples of p-type dopants in silicon comprise boron (B), gallium (Ga), aluminum (Al), etc. Examples of n-type dopants in silicon comprise phosphorus (P), arsenic (As), antimony (Sb), etc.

Figure 17:
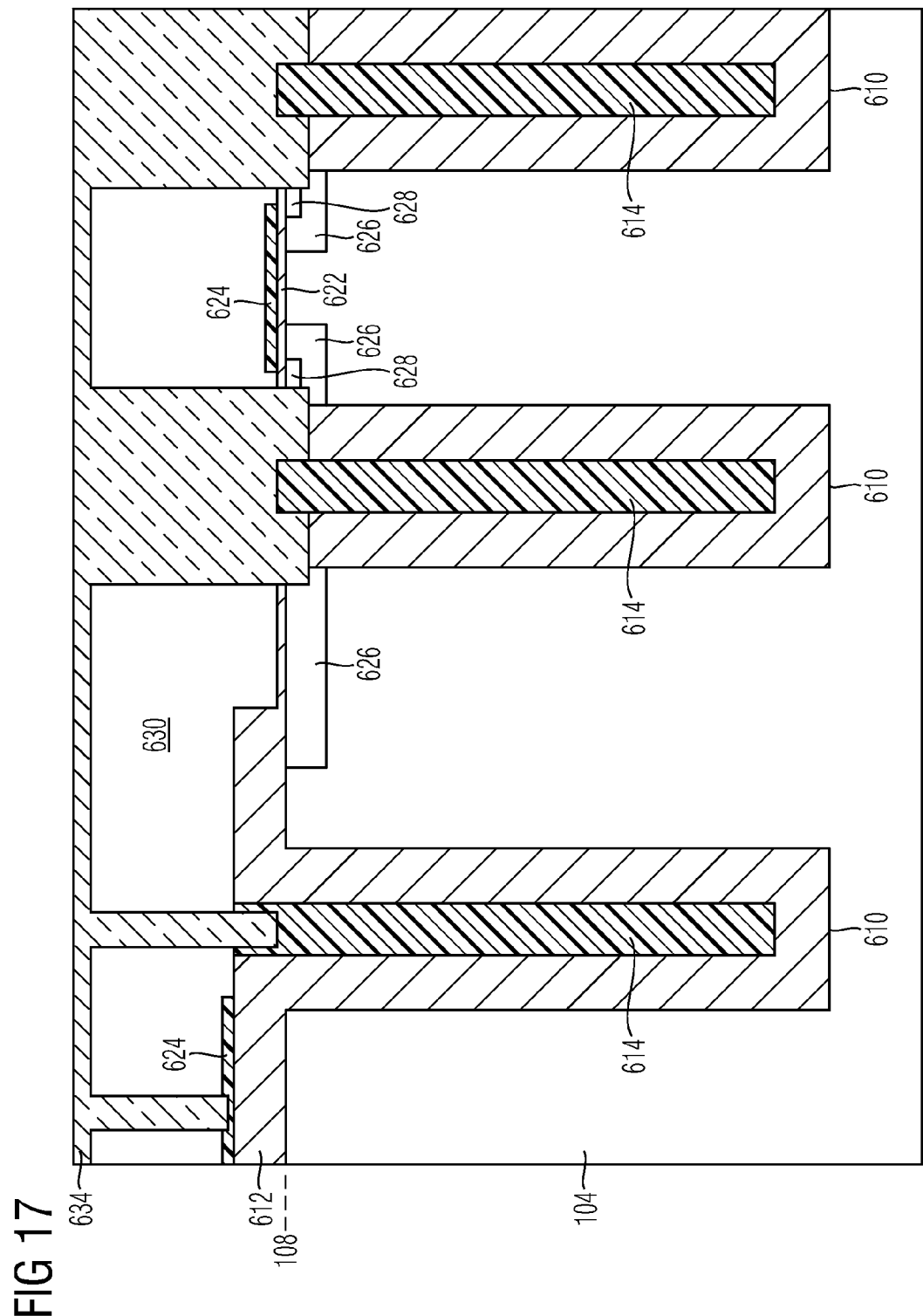

Referring to the schematic cross-sectional view of FIG. 17, a third dielectric material 630 is formed on the third conductive material 624 and on the first and second dielectric materials 612, 622 for the purpose of providing an interlayer dielectric in a transistor cell array to be formed. Opening are formed through the third dielectric material 630. Some of the openings further extend through the first dielectric material 612 and into the semiconductor body 104. A fourth conductive material 634 is formed on the third dielectric material 630 and in the openings for providing an electric contact to the first conductive material 614 and the first and second semiconductor regions 626, 628.

Figure 18:
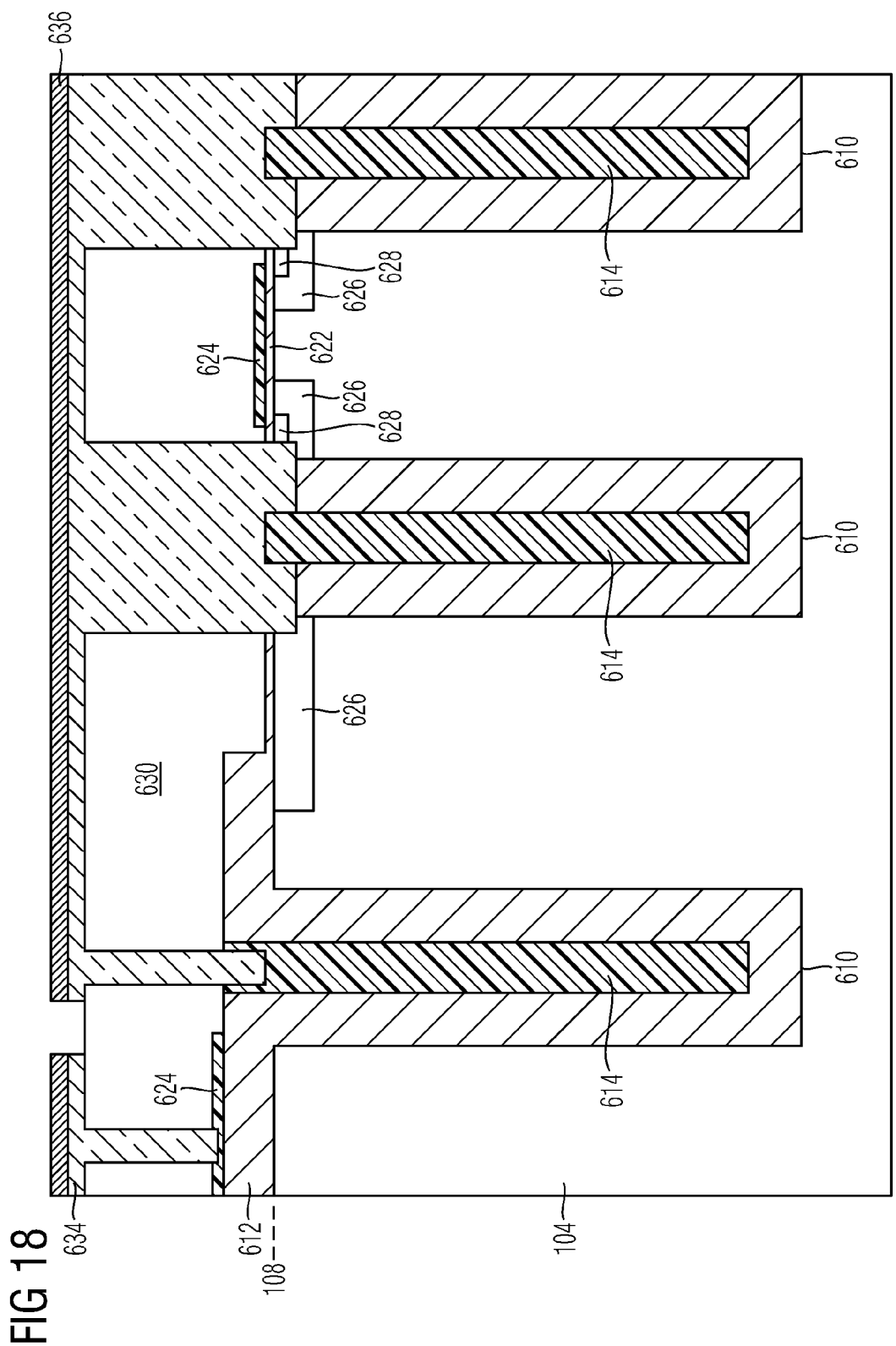

Referring to the schematic cross-sectional view of FIG. 18, a fifth conductive material 636 is formed on the fourth conductive material 634, for example a power metallization layer, for example a copper layer and/or a copper alloy such as AlCu. In some embodiments, formation of the fifth conductive material 636 may also be omitted. The fourth and fifth conductive materials 634, 636 are patterned to provide different electrodes, for example source and gate electrodes.

Further processes may follow at the first side 108 and/or at a second side opposite to the first side, for example drain contact formation at the second side, for completing front-end-of-line (FEOL) processing of the semiconductor device such as is illustrated in FIG. 1.

The second side of the semiconductor body 104 may, e.g., be attached on a carrier by gluing, soldering, or sintering. In case the semiconductor device is attached by soldering, a soft solder or a diffusion solder may be used to attach the semiconductor device. The semiconductor body 104 may, e.g., be attached with the second side on the carrier. The carrier may, e.g., be one of a lead frame, a ceramics substrate such as, e.g., a DCB (direct copper bonded) ceramics substrate, and a printed circuit board (PCB).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor cell array comprising transistor cells in a semiconductor body;
a planar gate structure on the semiconductor body at a first side;
field electrode trenches extending into the semiconductor body from the first side, each of the field electrode trenches comprising a field electrode structure;
a contact structure including a plurality of contacts electrically connected to the field electrode structure, wherein a gate electrode of the planar gate structure includes a plurality of first openings, each of the plurality of contacts extending through a corresponding one of the plurality of first openings and being fully surrounded by the gate electrode; and wherein
a depth d of the field electrode trenches is greater than a maximum lateral dimension wmax of the field electrode trenches at the first side.

2. The semiconductor device of claim 1, wherein a shape of the trenches at the first side is at least one of circular, elliptical, polygonal and polygonal with rounded corners.

3. The semiconductor device of claim 1, wherein each of the field electrode trenches includes a single field electrode electrically coupled to a source electrode.

4. The semiconductor device of claim 1, wherein the gate electrode is continuous in the transistor cell array and is, apart from the first openings, absent of second openings.

5. The semiconductor device of claim 1, wherein the gate electrode includes first sections, each of the first sections running around a corresponding one of the plurality of contacts, and second sections, each of the second sections.

6. The semiconductor device of claim 1, wherein the gate electrode structure includes a plurality of stripe-shaped gate electrodes extending parallel.

7. The semiconductor device of claim 1, wherein a contact structure electrically connected to the field electrodes extends into the semiconductor body at the first side, and wherein a source region of the transistor cells is electrically connected to a side wall of the contact structure in the semiconductor body.

8. The semiconductor device of claim 1, wherein a gate electrode of the gate electrode structure includes first and second gate electrode parts spaced from one another along a lateral direction between neighboring two of the field electrode trenches.

9. The semiconductor device of claim 8, wherein the second gate electrode part is electrically connected to a source electrode.

10. The semiconductor device of claim 8, wherein a gate dielectric of the gate electrode structure includes first and second gate dielectric parts, the first gate dielectric part having a thickness d1 and being sandwiched between the first gate electrode part and the semiconductor body, the second gate dielectric part having a thickness d2 and being sandwiched between the second gate electrode part and the semiconductor body, and wherein the first thickness is greater than the second thickness and the second gate electrode is electrically connected to a source electrode.

11. The semiconductor device of claim 8, wherein body and source regions are arranged between the first and second gate electrode parts.

12. The semiconductor device of claim 8, wherein body and source regions are arranged between the first gate electrode part and one of the neighboring two of the field electrode trenches and between the second gate electrode part and another one of the neighboring two of the field electrode trenches.

13. The semiconductor device of claim 1, wherein a gate electrode of the gate electrode structure includes a single gate electrode part between the neighboring two of the field electrode trenches.

14. The semiconductor device of claim 13, wherein a net doping concentration in an upper part of a mesa region adjoining a gate dielectric is smaller than in a lower part of the mesa region below the upper part.

15. The semiconductor device of claim 13, wherein a net doping concentration in an upper part of a mesa region adjoining a gate dielectric is greater than in a lower part of the mesa region below the upper part.

16. The semiconductor device of claim 1, wherein a width wm of mesa region between neighboring two of the field electrode trenches at the first side is smaller than a width wt of each of the field electrode trenches.

17. The semiconductor device of claim 1, wherein each of the field electrode trenches includes a plurality of field electrodes subsequently arranged along a vertical direction perpendicular to the first side.

18. The semiconductor device of claim 1, wherein the semiconductor device is a vertical insulated gate field effect transistor comprising a first load electrode at the first side and a second load electrode at a second side opposite to the first side, and wherein the semiconductor device further comprises a junction termination area surrounding the transistor cell array, the junction termination area comprising junction termination structures.

19. The semiconductor device of claim 18, wherein the junction termination structures comprise a plurality of junction termination trenches extending into the semiconductor body from the first side, each of the junction termination trenches comprising a junction termination electrode structure electrically coupled to a source electrode, and wherein a depth dd of the junction termination trenches is greater than a maximum lateral dimension wwmax of the junction termination trenches at the first side.

20. A semiconductor device, comprising:
a transistor cell array comprising transistor cells in a semiconductor body;
a planar gate structure on the semiconductor body at a first side;
field electrode trenches extending into the semiconductor body from the first side, each of the field electrode trenches comprising a field electrode structure; and wherein
a depth d of the field electrode trenches is greater than a maximum lateral dimension wmax of the field electrode trenches at the first side, and a gate electrode of the gate electrode structure includes first and second gate electrode parts spaced from one another along a lateral direction between neighboring two of the field electrode trenches.

21. The semiconductor device of claim 20, wherein the second gate electrode part is electrically connected to a source electrode.

22. The semiconductor device of claim 20, wherein a gate dielectric of the gate electrode structure includes first and second gate dielectric parts, the first gate dielectric part having a thickness dl and being sandwiched between the first gate electrode part and the semiconductor body, the second gate dielectric part having a thickness d2 and being sandwiched between the second gate electrode part and the semiconductor body, and wherein the first thickness is greater than the second thickness and the second gate electrode is electrically connected to a source electrode.

23. The semiconductor device of claim 20, wherein body and source regions are arranged between the first and second gate electrode parts.

24. The semiconductor device of claim 20, wherein body and source regions are arranged between the first gate electrode part and one of the neighboring two of the field electrode trenches and between the second gate electrode part and another one of the neighboring two of the field electrode trenches.

* * * * *